(12) United States Patent
Leen et al.

(10) Patent No.: US 10,993,336 B2
(45) Date of Patent: Apr. 27, 2021

(54) USER INTERFACE MODULE FOR A BUILDING CONTROL SYSTEM WITH AN INTERCHANGEABLE MOUNTING BASE

(71) Applicant: Honeywell International Inc., Morris Plains, NJ (US)

(72) Inventors: Cary Leen, Hammond, WI (US); Haitao Li, Beijing (CN); Arthur Zhang, Beijing (CN); Michael Zheng, Beijing (CN); Tonya Tang, Beijing (CN); Timo Tapio Pihlajasaari, Gelnhausen (DE); Andrew D. Halford, Manchester, MD (US); Sanjoy Bhattacharjee, Kolkata (IN); Derek Tai, Tsuen Wan (HK)

(73) Assignee: Honeywell International Inc., Charlotte, NC (US)

( * ) Notice: Subject to any disclaimer, the term of this patent is extended or adjusted under 35 U.S.C. 154(b) by 0 days.

(21) Appl. No.: 16/120,254

(22) Filed: Sep. 1, 2018

(65) Prior Publication Data

US 2020/0077527 A1 Mar. 5, 2020

(51) Int. Cl.
*H05K 5/00* (2006.01)
*H05K 3/30* (2006.01)
*H05K 5/02* (2006.01)

(52) U.S. Cl.
CPC .......... *H05K 5/0017* (2013.01); *H05K 3/30* (2013.01); *H05K 5/0204* (2013.01); *H05K 5/0247* (2013.01)

(58) Field of Classification Search
CPC ...... H05K 5/0017; H05K 3/30; H05K 5/0247; H05K 5/0204
See application file for complete search history.

(56) References Cited

U.S. PATENT DOCUMENTS

| | | |
|---|---|---|
| 4,669,030 A | 5/1987 | Bannister |
| 5,204,805 A | 4/1993 | Takahashi et al. |
| 6,563,697 B1 | 5/2003 | Simbeck et al. |
| 7,652,395 B2 | 1/2010 | Von Arx et al. |
| 7,715,176 B2 | 5/2010 | Perez et al. |
| 9,632,112 B2 | 4/2017 | Harding et al. |
| 9,869,611 B1 | 1/2018 | Ryan et al. |
| 2004/0106331 A1* | 6/2004 | Hoegener ............ H05K 5/0204 439/701 |
| 2005/0083168 A1* | 4/2005 | Breitenbach ....... G05D 23/1904 337/380 |

(Continued)

OTHER PUBLICATIONS

European Application No. 19194804, Partial Search Report, pp. 11, dated Jan. 24, 2020.

(Continued)

*Primary Examiner* — Hung S. Bui
*Assistant Examiner* — Sagar Shrestha
(74) *Attorney, Agent, or Firm* — Seager, Tufte & Wickhem, LLP (57) ABSTRACT

The present disclosure relates to a user interface module for a building control system that has flexible mounting options to address mounting constraints that are often encountered in utility rooms and/or equipment panels. In some cases, the user interface module may be provided with interchangeable mounting bases from which an installer can select depending on the mounting constraints presented at a particular installation.

12 Claims, 8 Drawing Sheets

(56) References Cited

U.S. PATENT DOCUMENTS

| | | | |
|---|---|---|---|
| 2006/0230297 A1* | 10/2006 | Peterson | H05K 5/0204 |
| | | | 713/300 |
| 2008/0284614 A1* | 11/2008 | Perez | G01R 22/065 |
| | | | 340/870.02 |
| 2011/0164388 A1* | 7/2011 | Ozaki | B60R 11/0235 |
| | | | 361/725 |
| 2012/0068832 A1* | 3/2012 | Feldstein | F16M 11/041 |
| | | | 340/12.5 |
| 2016/0091903 A1 | 3/2016 | Patton et al. | |
| 2016/0178230 A1 | 6/2016 | Vendt et al. | |
| 2017/0051866 A1* | 2/2017 | Chen | F16M 11/041 |
| 2017/0311462 A1 | 10/2017 | Kamensek et al. | |
| 2018/0052429 A1 | 2/2018 | Ryan et al. | |
| 2018/0092235 A1 | 3/2018 | Mielnik et al. | |
| 2018/0107609 A1 | 4/2018 | Kumar KN et al. | |
| 2018/0203475 A1 | 7/2018 | Van Derven et al. | |

OTHER PUBLICATIONS

European Application No. 19194804, Extended Search Report, pp. 12, dated Apr. 20, 2020.

* cited by examiner

USER INTERFACE MODULE FOR A BUILDING CONTROL SYSTEM WITH AN INTERCHANGEABLE MOUNTING BASE

TECHNICAL FIELD

The present disclosure pertains to building control systems. More particularly, the present disclosure pertains to a user interface module for a building control system that has flexible mounting options to address mounting constraints often encountered in utility rooms or equipment panels.

BACKGROUND

Building control systems are used to control systems of a building, and often include one or more building control devices that control one or more building control components. Such building control systems can include Heating, Ventilation and/or Air Conditioning (HVAC) systems, building security systems, building lighting control systems and/or any other suitable building control system. In many instances, a building control system includes a main controller that receives sensor and/or other data, and in response, provides control signals to control various building control components in the building in accordance with a control algorithm. In some cases, the main controller may be operatively coupled to one or more input/output modules, which may be wired or otherwise connected to the one or more building control components. In some case, a user interface may be integrated into the main controller. In other cases, a separate user interface module may be provided for interfacing with the building control devices.

In many cases, the building control devices may be mounted in a utility room or the like of the building. The available mounting options are often dependent on that particular characteristics of the utility room. In many cases, there are significant constraints on where the building control devices can be mounted. Often, the building control devices must be mounted in cramped quarters, such as on a wall between other equipment, or in an equipment panel or cabinet. Equipment panels and cabinets have limited size, and often house various equipment such as power supplies, terminal strips, wiring, and in some cases the building control devices. In some cases, an equipment panel or cabinet may include a DIN rail for mounting DIN rail compatible equipment including DIN rail compatible building control devices. When an equipment panel or cabinet can accommodate a separate user interface module, such as on a DIN rail or the like of the equipment panel or cabinet, the separate user interface module may be located at a position that is too high or too low and not convenient for a user to read or comfortably operate. In many instances, an equipment panels or cabinet will not be able to accommodate a separate user interface module. In such instances, the user interface module may need to be mounted outside of the equipment panel or cabinet and be operatively connected to the building control devices within the equipment panel or cabinet.

There is a need in the building control industry for a building control system with a separate user interface module that has flexible mounting options to address the various constraints on mounting the user interface module found in many utility rooms.

SUMMARY

The present disclosure relates to a user interface module for a building control system that has flexible mounting options to address mounting constraints that are often encountered in utility rooms and/or equipment panels. In some cases, the user interface module may be provided with interchangeable mounting bases from which an installer can select depending on the mounting constraints presented at a particular installation.

In one example, a user interface assembly includes a user interface module including a housing that houses a display and a mounting base for mounting the user interface module. The mounting base may have a first side configured to mount the mounting base to a mounting surface and a second opposing side configured to mount the user interface module to the mounting base. In some cases, the mounting base may configured to be mounted to a DIN rail or the like. In some cases, the mounting base may be configured to allow the second side, and thus the user interface module, to be moved between two or more orientations relative to the first side of the mounting base. This may allow the user to, for example, tilt the orientation of the user interface module up when the user interface module is mounted below eye level of the user and tilt the orientation of the user interface module down when the user interface module is mounted above eye level of the user. Alternatively, or in addition, the user interface module may swivel or rotate about an axis that extends away from the mounting surface. This may allow, for example, the mounting base to be mounted on a vertical DIN rail, and the user interface module may be rotated 90 degrees or the like relative to the mounting base so the longer dimension of the display is orientated in a horizontal direction. The ability to re-orientate the user interface module relative to the mounting surface may make it more convenient for the user to read and comfortably interact with the user interface module.

In some cases, two or more interchangeable mounting bases may be provided. For example, the installer may select the above referenced mounting base when the user interface module is to be mounted to a DIN rail, and may select an auxiliary mounting base when the user interface module is to be mounted to an open wall of the utility room or to a door of an equipment panel or the like. The auxiliary mounting base may have a first side configured to mount the auxiliary mounting base to a mounting surface and a second opposing side configured to mount the user interface module to the auxiliary mounting base. In some cases, the auxiliary mounting base does not allow the second side of the auxiliary mounting base, and thus the user interface module, to be moved between two or more orientations relative to the first side of the auxiliary mounting base. This is just an example. It is contemplated that the user interface module and any of the interchangeable mounting bases may be simply snapped together via an interference connection. In some cases, a tool may be required to release the interference connection to help prevent the user interface module from being stolen, but this is not required.

An illustrative method may include determining when the user interface module is to be mounted to a DIN rail, and when so, selecting a first mounting base that has a first side configured to mount the first mounting base to the DIN rail and a second opposing side configured to mount the user interface module to the first mounting base, mounting the first mounting base to the DIN rail, and mounting the user interface module to the first mounting base. The method may also include determining when the user interface module is to be mounted to a wall or a door of an equipment panel, and when so, selecting a second mounting base that is has a first side configured to mount the second mounting base to the wall or door of the equipment panel and a second opposing side configured to mount the user interface module to the second mounting base, mounting the second mounting base to the wall or door of the equipment panel, and mounting the user interface module to the second mounting base. In some cases, the first mounting base may allow the second side of the first mounting base, and thus the user interface module, to be moved between two or more orientations relative to the first side of the first mounting base.

The preceding summary is provided to facilitate an understanding of some of the features of the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments of the disclosure in connection with the accompanying drawings, in which:

FIG. 7 is a side view of the illustrative mounting base and user interface module of FIG. 5 mounted to a wall of a utility room or the like.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DESCRIPTION

The following description should be read with reference to the drawings wherein like reference numerals indicate like elements. The drawings, which are not necessarily to scale, are not intended to limit the scope of the disclosure. In some of the figures, elements not believed necessary to an understanding of relationships among illustrated components may have been omitted for clarity.

All numbers are herein assumed to be modified by the term "about", unless the content clearly dictates otherwise. The recitation of numerical ranges by endpoints includes all numbers subsumed within that range (e.g., 1 to 5 includes 1, 1.5, 2, 2.75, 3, 3.80, 4, and 5).

As used in this specification and the appended claims, the singular forms "a", "an", and "the" include the plural referents unless the content clearly dictates otherwise. As used in this specification and the appended claims, the term "or" is generally employed in its sense including "and/or" unless the content clearly dictates otherwise.

It is noted that references in the specification to "an embodiment", "some embodiments", "other embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is contemplated that the feature, structure, or characteristic may be applied to other embodiments whether or not explicitly described unless clearly stated to the contrary.

Figure 1:
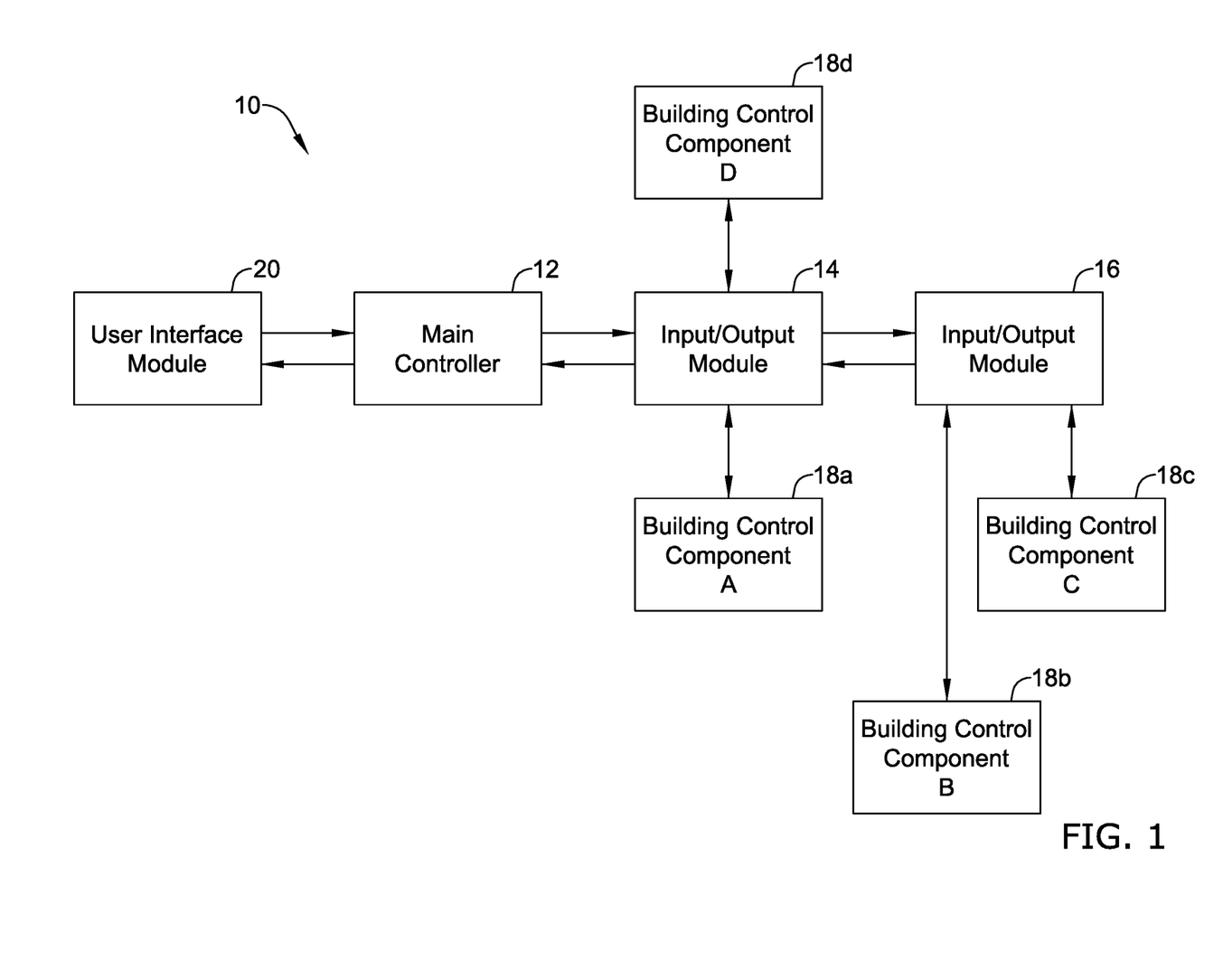
FIG. 1 is a schematic view of an illustrative building control system.

FIG. 1 is a schematic view of an illustrative building control system. It is contemplated that the building control system 10 may include an Heating, Ventilation and/or Air Conditioning (HVAC) system, a building security system, a building lighting control system and/or any other suitable building control system. In some cases, the building control system 10 may include one or more building control devices. The one or more building control devices may include, for example, a main controller 12, input/output modules 14 and 16, and/or any other suitable building control device. In the example shown, the main controller 12 is configured to receive sensor and/or other data, and in response, provide control signals in accordance with a control algorithm to control various building control components 18a-18d in the building. In some cases, the main controller 12 may receive the sensor and/or other data and provided control signals to building control components 18a-18d via one or more input/output modules 14 and 16. When so provided, the one or more input/output modules 14 and 16 may be operatively connected to the main controller 12 and wired or otherwise connected to the one or more building control components 18a-18d. It is contemplated that the one or more building control components 18a-18d may include, for example, fans, blowers, dampers, sensors and/or detectors, actuators and/or any other suitable building control components.

In some case, a user interface module 20 may be provided for interfacing with the building control devices. In the example shown, the user interface module 20 is operatively connected to the main controller 12. The user interface module 20 may include a housing that houses a display. The display may be a touch screen display. In some cases, the user interface module 20 may include one or more tactile buttons for use by the user in interacting with the user interface module 20.

It is contemplated that the user interface module 20 may provide a rich user interface for local access to the main controller 12, thereby providing a convenient way for a user to locally control/check the operation of the building control system 10. In some cases, a user may user the user interface module to view and command building control components 18a-18d (points), view and acknowledge alarms, view and program schedules/calendars, provide password protection, displaying/creating fast access lists, and/or perform any other desired task. These are just examples.

Figure 2:
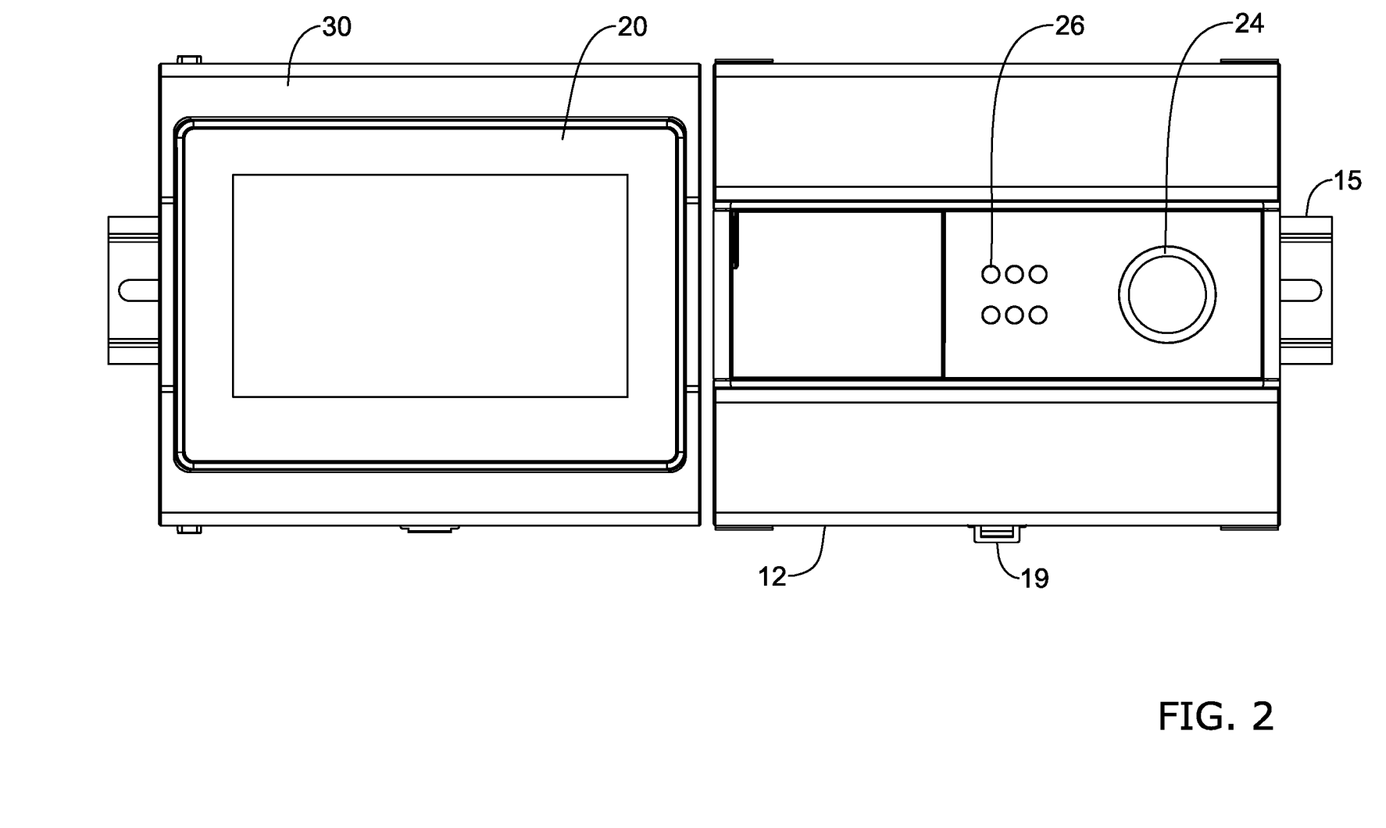
FIG. 2 is a schematic view of an illustrative building control system mounted on a DIN rail.

FIG. 2 is a schematic view of an illustrative building control system 10 mounted on a DIN rail 15. In the example shown, the building control system includes a main controller 12 and a user interface module 20. In the example shown, the main controller 12 does not include a dot matrix display. Instead, the main controller 12 includes a light ring 24 that, for example, can be animated and/or changes color to provide an operational status of the main controller 12. For example, the light ring 24 may be green to indicate that the main controller 12 is operating normally, yellow to indicate that the main controller 12 has one or more minor faults and red to indicate that the main controller 12 has one or more major faults that need a user's immediate attention. A set of LED lights 26 may also be used to indicate the connection status of each of a number of I/O pins.

Figure 3A:
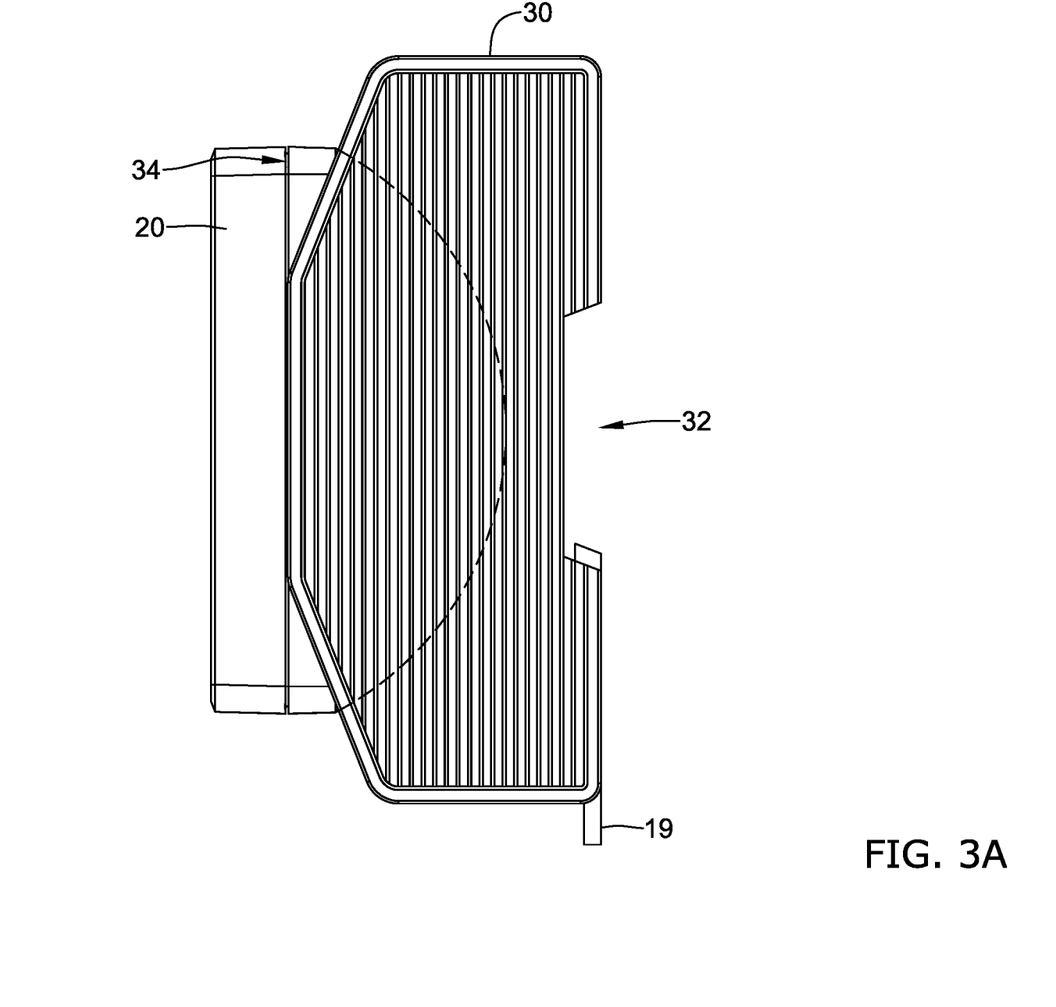
FIG. 3A is a side view of an illustrative user interface module mounted to a mounting base.
Figure 3B:
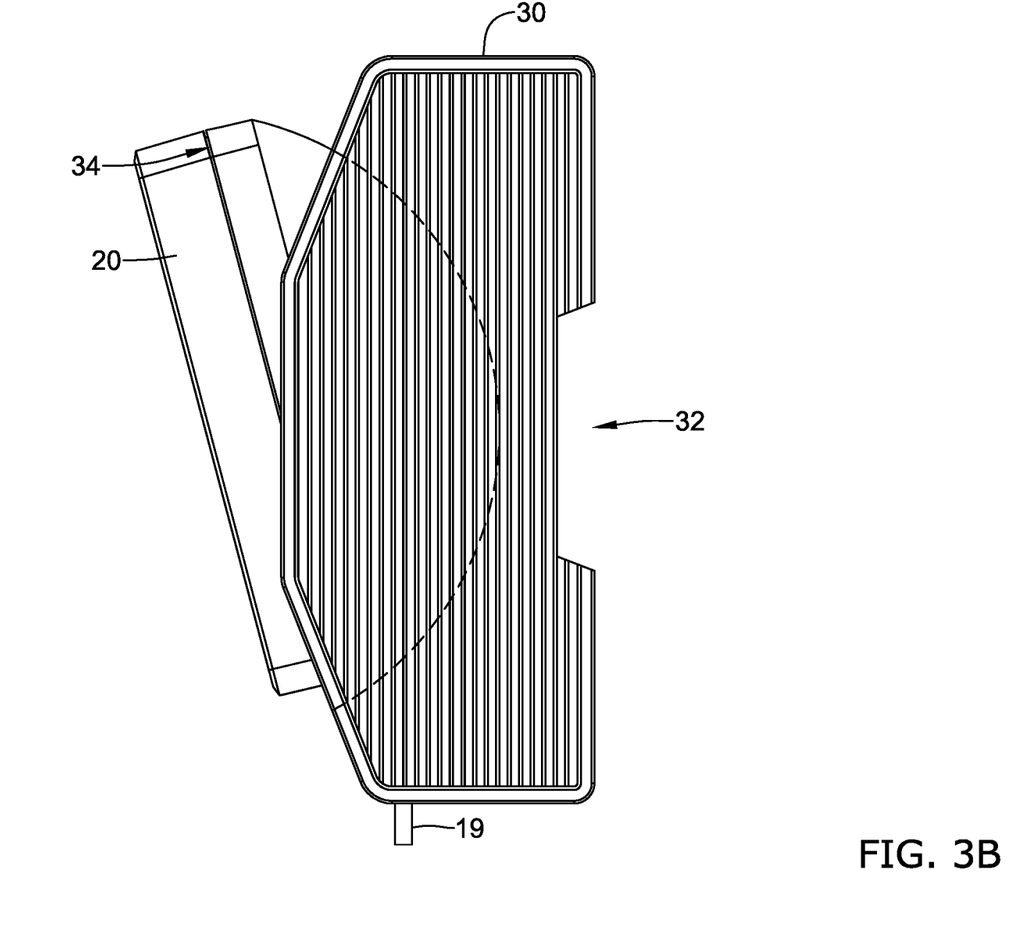
FIG. 3B is a side view of the illustrative user interface module and mounting base of FIG. 3A, with the user interface module tilted in a downward orientation.

The user interface module 20 is shown mounted to a mounting base 30 that is configured to be mounted on the DIN rail 15. FIG. 3A is a side view of the illustrative user interface module 20 mounted to the mounting base 30. The mounting base 30 may have a first side 32 configured to mount the mounting base 30 to the DIN rail 15, and a second opposing side 34 configured to mount the user interface module 20 to the mounting base 30. In some cases, the mounting base 30 may be configured to allow the second side 34, and thus the user interface module 20, to be moved between two or more orientations relative to the first side 32 of the mounting base 30. FIG. 3A shows the second opposing surface 34, and thus the user interface module 20, facing horizontally. FIG. 3B shows the second opposing surface 34, and thus the user interface module 20, tilted in a downward orientation. It is contemplated that the second opposing surface 34, and thus the user interface module 20, may also be tilted in an upward orientation. This may allow the user to, for example, tilt the orientation of the user interface module 20 up when the mounting base 30 and the user interface module 20 are mounted below eye level of the user, and tilt the orientation of the user interface module 20 down when the mounting base 30 and the user interface module 20 are mounted above eye level of the user. In some cases, the second opposing surface 34, and thus the user interface module 20, may be tilted in the left and/or right direction, in addition to or instead of, the up and down direction. In some cases, the second opposing surface 34, and thus the user interface module 20, may be moved to face any desired direction. Alternatively, or in addition, the user interface module 20 may swivel or rotate about an axis that extends away from the mounting surface. This may allow, for example, the mounting base 30 to be mounted on a vertical DIN rail, and the user interface module 20 may be rotated 90 degrees or the like relative to the mounting base 30 so the longer dimension of the display is orientated in a horizontal direction. The ability to re-orientate the user interface module 20 relative to the mounting surface may make it more convenient for the user to read and comfortably interact with the user interface module 20 once mounted in the utility room or in an equipment panel.

In some cases, the main controller 12 and the mounting base 30 may be attached to the DIN rail 15 with corresponding fastening clips 19, but this is not required. In some cases, the main controller 12 and the mounting base 30 may include side-by-side plugs and jacks to electrically connect the main controller and the mounting base 30. The mounting base 30 may extend this connection to the user interface module 20 via one or more connectors 46 and 66, as further described below.

Figure 4:
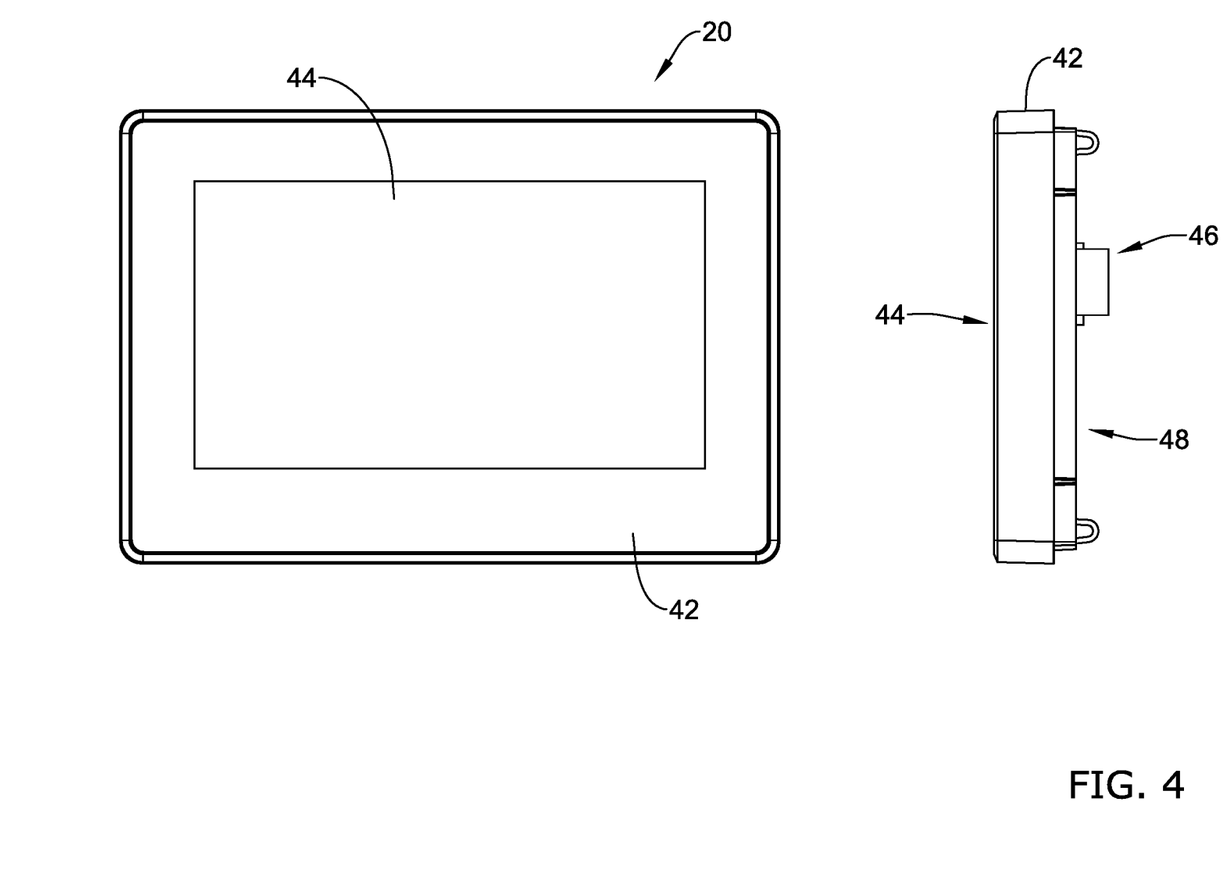
FIG. 4 is a front and side view of an illustrative user interface module.

FIG. 4 is a front and side view of the illustrative user interface module 20. The illustrative user interface module 20 includes a housing 42 that houses a display 44. The display 44 may be a touch screen display. In some cases, the user interface module 20 may include one or more tactile buttons (not shown) for use by the user in interacting with the user interface module 20. In the example shown, the user interface module 20 also includes a connector 46 along the back side 48. The connector 46 can include pogo-pins, terminal block and/or any other suitable connector. The connector 46 may provide a connector for data and/or power signals to be transmitted between the user interface module 20 and the main controller 12. The mounting base 30 that the user interface module 20 is mounted to may include a corresponding connector that is configured to interface with the connector 46 of the user interface module 20. The connector of the mounting base 30 may provide a connection to the main controller 12. In some cases, the connection may be made through a communication bus that is integrated into the DIN rail 15, or through a cable or other connection, depending on the application. In some cases, data may be communicated between the user interface module 20 and the main controller 12 via a wireless connection. These are just examples.

Figure 5:
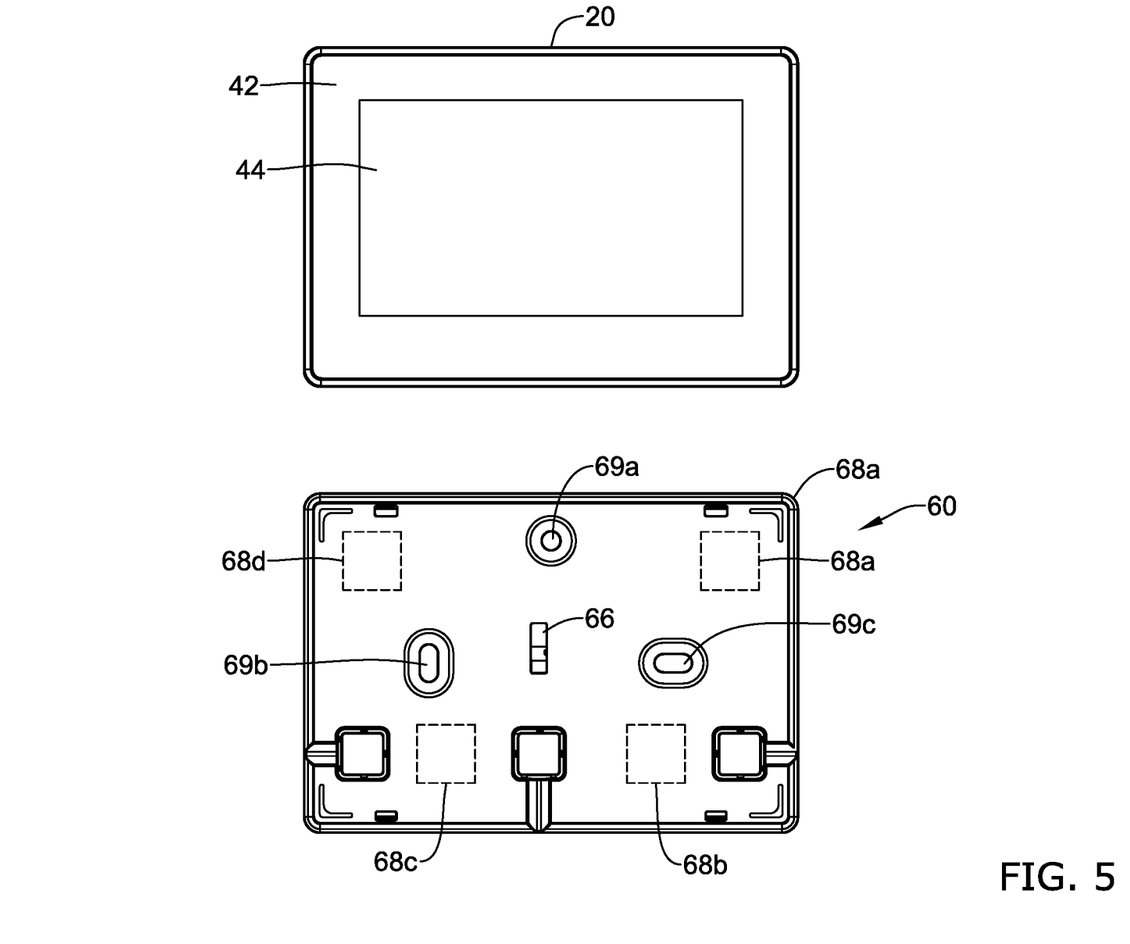
FIG. 5 is a front view of the illustrative user interface module of FIG. 4 and a front view of another illustrative mounting base.

FIG. 5 is a front view of the illustrative user interface module 20 of FIG. 4 and a front view of another illustrative mounting base 60. In this case, the mounting base 60 is configured to mount the user interface module 20 to a wall in a utility room, a door of an equipment panel, or any other suitable surface. In this case, the mounting base 60 does not allow the user interface module 20 to be moved between two or more orientations. Instead, the user interface module 20 is held in one orientation relative to the mounting base 60.

In the example shown, the mounting base 60 may include a connector 66, which is positioned to connect to a corresponding connector 46 on the back side of the user interface module 20. In some cases, the back surface of the mounting base 60 may have one or more channels for accommodating one or more cables between the back surface of the mounting base 60 and the mounting surface (e.g. a wall of a utility room or a door of an equipment panel).

Figure 6A:
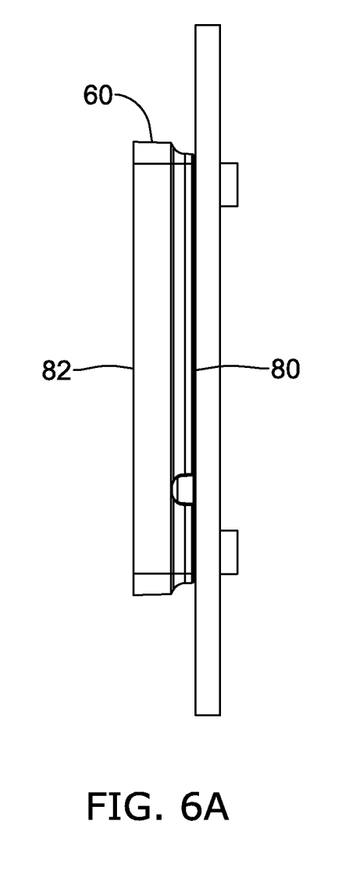
FIG. 6A is side view of the illustrative mounting base of FIG. 5 mounted to a door of an equipment panel.
Figure 6B:
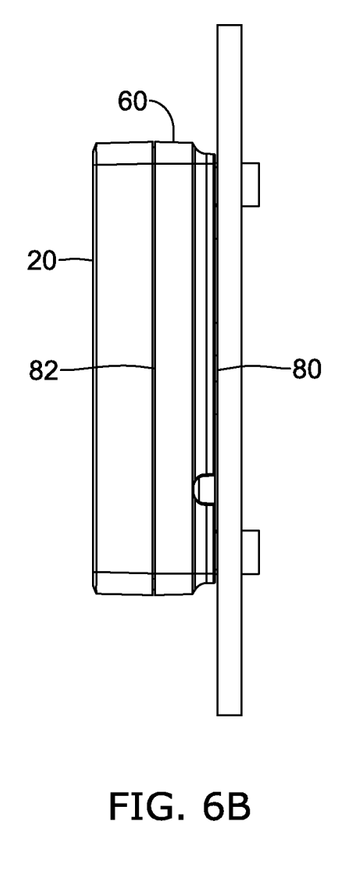
FIG. 6B is side view of the illustrative mounting base of FIG. 6A with the illustrative user interface module of FIG. 5 mounted thereto.
Figure 7:
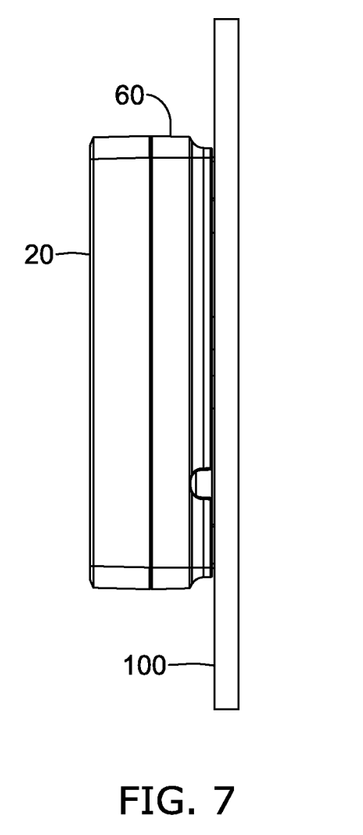

It is also contemplated that the mounting base 60 may have one or more mounting holes 69a-69c for accepting screws or the like for mounting the mounting base 60 to a mounting surface such as a wall. In some cases, the mounting base 60 may carry one or more magnets 68a-68d as shown in FIG. 5. The magnets 68a-68d may be particularly well suited for mounting the mounting base 60 to a door or the like of an equipment panel. Rather than using screws or the like, the mounting base 60 may be held in place by the attraction force applied by one or more corresponding magnets 70a-70d (or ferromagnetic material) placed on the opposite side of the door or made part of the door, as best shown in FIG. 6A. FIG. 6B shows the mounted mounting base 60 of FIG. 6A, with the user interface module 20 snapped to the mounting base 60. FIG. 7 shows the mounting base 60 of FIG. 5 mounted to a wall 100 with screws or the like through the mounting holes 69a-69c.

In some cases, two or more interchangeable mounting bases may be provided for the user interface module 20. For example, the installer may select the mounting base 30 shown in FIGS. 2-3B when the user interface module 20 is to be mounted to a DIN rail 15. The installer may select the mounting base 60 shown in FIGS. 5-7 (e.g. an auxiliary mounting base) when the user interface module 20 is to be mounted to an open wall of the utility room or to a door of an equipment panel or the like. The mounting base 60 may have a first side (back side) 80 configured to mount the mounting base 60 to a mounting surface such as a wall or door, and a second opposing side (front side) 82 configured to mount the user interface module 20 to the mounting base 60. It is contemplated that the user interface module 20 and any of the interchangeable mounting bases (e.g. mounting base 30 and mounting base 60) may be simply snapped together via an interference connection. In some cases, a tool may be required to release the interference connection to help prevent the user interface module 20 from being stolen, but this is not required. The tool may be screw driver, or may be a specialty tool. In some cases, the tool may have a shape that is keyed to the release mechanism.

An illustrative method may include determining when the user interface module 20 is to be mounted to a DIN rail 15, and when so, selecting a first mounting base 30 that has a first side 32 configured to mount the first mounting base 30 to the DIN rail 15 and a second opposing side 34 configured to mount the user interface module 20 to the first mounting base 30, mounting the first mounting base 30 to the DIN rail 15, and mounting the user interface module 20 to the first mounting base 30. The method may also include determining when the user interface module 20 is to be mounted to a wall or a door of an equipment panel, and when so, selecting a second mounting base 60 that is has a first side 80 configured to mount the second mounting base 60 to the wall or door of the equipment panel and a second opposing side 82 configured to mount the user interface module 20 to the second mounting base 60, mounting the second mounting base 60 to the wall or door of the equipment panel, and mounting the user interface module 20 to the second mounting base 60. In some cases, the first mounting base 30 may allow the second side 34 of the first mounting base 30, and thus the user interface module 20, to be moved between two or more orientations relative to the first side 32 of the first mounting base 30.

Those skilled in the art will recognize that the present disclosure may be manifested in a variety of forms other than the specific embodiments described and contemplated herein. Accordingly, departure in form and detail may be made without departing from the scope and spirit of the present disclosure as described in the appended claims.

What is claimed is:

1. A user interface assembly for a building control system, the user interface assembly comprising:
   a user interface module including a housing that houses a display, wherein the user interface module is configured to be operatively connected to one or more building control devices of the building control system and provide a user interface for the one or more building control devices;
   a mounting base for mounting the user interface module, the mounting base having a first side configured to mount the mounting base to a mounting surface comprising a DIN rail and a second opposing side configured to mount the user interface module to the mounting base in order to releasably secure the user interface module to the mounting base and thus releasably secure the user interface module relative to the DIN rail; and
   wherein the mounting base is configured to allow the second side, and thus the user interface module, to be pivoted between a first orientation in which the user interface module is tilted upward relative to the DIN rail to accommodate mounting below a user's eye level and a second orientation in which the user interface module is tilted downward relative to the DIN rail to accommodate mounting above the user's eye level.

2. The user interface assembly of claim 1, wherein the user interface module includes a first input/output port and wherein the mounting base comprises a second input/output port that interfaces with the first input/output port of the user interface module when the user interface module is mounted to the mounting base.

3. The user interface assembly of claim 2, wherein the user interface module includes an input/output port and the mounting base comprises a connector for connecting the input/output port of the user interface module to one or more of the building control devices.

4. The user interface assembly of claim 1, wherein a tool is required to release the user interface module from the mounting base.

5. The user interface assembly of claim 1, wherein the second side of the mounting base is configured to form an interference connection with the user interface module when mounting the user interface module to the mounting base.

6. The user interface assembly of claim 5, wherein the interference connection is configured to require a tool to release the interference connection.

7. The user interface assembly of claim 1, wherein the mounting base is configured to allow the second side, and thus the user interface module, to rotate about a rotation axis.

8. The user interface assembly of claim 1, further comprising an auxiliary mounting base, wherein the auxiliary mounting base has a first side configured to mount the auxiliary mounting base to a mounting surface and a second opposing side configured to mount the user interface module to the auxiliary mounting base, wherein the auxiliary mounting base does not allow the second side of the auxiliary mounting base, and thus the user interface module, to be moved between two or more orientations relative to the first side of the auxiliary mounting base.

9. The user interface assembly of claim 1, wherein the first side of the mounting base comprises a channel for accommodating one or more cables between the first side and the mounting surface.

10. A user interface assembly for a building control system, wherein the user interface assembly is configured to be operatively connected to one or more building control devices and provide a user interface for the one or more building control devices, the user interface assembly comprising:
    a user interface module including a housing, a display and an input/output port;
    a mounting base for mounting the user interface module, the mounting base having a first side configured to removably mount the mounting base to a DIN rail and a second opposing side configured to removably mount the user interface module to the mounting base;
    wherein the mounting base comprises an input/output port that interfaces with the input/output port of the user interface module when the user interface module is mounted to the mounting base; and
    wherein the mounting base is configured to allow the second side, and thus the user interface module, to tilt up and/or tilt down relative to the first side of the mounting base.

11. The user interface assembly of claim 10, wherein the second side of the mounting base is configured to form an interference connection with the user interface module when mounting the user interface module to the mounting base.

12. The user interface assembly of claim 11, wherein the interference connection is configured to require a tool to release the interference connection.

* * * * *